US012591280B2

(12) United States Patent
North et al.

(10) Patent No.: US 12,591,280 B2
(45) Date of Patent: Mar. 31, 2026

(54) THERMAL MANAGEMENT SYSTEM FOR AN INFORMATION HANDLING SYSTEM

(71) Applicant: Dell Products L.P., Round Rock, TX (US)

(72) Inventors: Travis C. North, Cedar Park, TX (US); Enoch Chen, Taipei City (TW); Pomin Shih, Taipei City (TW); Michael James Pescetto, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 301 days.

(21) Appl. No.: 18/494,146

(22) Filed: Oct. 25, 2023

(65) Prior Publication Data

US 2025/0138607 A1 May 1, 2025

(51) Int. Cl.
*G06F 1/20* (2006.01)
*H05K 7/20* (2006.01)

(52) U.S. Cl.
CPC ......... *G06F 1/206* (2013.01); *H05K 7/20136* (2013.01); *H05K 7/20209* (2013.01); *H05K 7/20454* (2013.01)

(58) Field of Classification Search
CPC ................ G06F 1/206; H05K 7/20136; H05K 7/20209; H05K 7/20454
See application file for complete search history.

(56) References Cited

U.S. PATENT DOCUMENTS

| | | | | |
|---|---|---|---|---|
| 6,241,007 | B1 * | 6/2001 | Kitahara | G06F 1/203 |
| | | | | 361/689 |
| 8,395,898 | B1 * | 3/2013 | Chamseddine | F28D 7/0075 |
| | | | | 361/695 |
| 10,856,441 | B1 * | 12/2020 | Huang | H05K 7/20727 |
| 10,948,240 | B2 * | 3/2021 | Hsieh | F28F 21/086 |
| 11,547,017 | B2 * | 1/2023 | Uchino | G06F 1/203 |
| 2004/0201958 | A1 * | 10/2004 | Lev | H01L 23/467 |
| | | | | 361/679.48 |
| 2009/0219695 | A1 * | 9/2009 | Tomioka | G06F 1/203 |
| | | | | 165/104.26 |
| 2010/0139895 | A1 * | 6/2010 | Hwang | H01L 23/427 |
| | | | | 165/104.26 |
| 2010/0157522 | A1 * | 6/2010 | Refai-Ahmed | G06F 1/20 |
| | | | | 361/679.54 |
| 2018/0164042 | A1 * | 6/2018 | Stellman | C25D 5/10 |
| 2019/0383528 | A1 * | 12/2019 | Sung | F25B 21/02 |

(Continued)

*Primary Examiner* — Michael A Matey
(74) *Attorney, Agent, or Firm* — McDermott Will & Schulte LLP

(57) ABSTRACT

A thermal management system, including a fan including: a fan housing; an impeller coupled to the fan housing; a fin stack coupled to the fan; a heat pipe having a first end and a second end, the heat pipe in thermal communication with a computing element at the first end of the heat pipe; a vapor chamber coupled to the fan housing, the vapor chamber and the fan housing encasing the impeller, the vapor chamber coupled to the second end of the heat pipe, the vapor chamber in fluid communication with the heat pipe, wherein the heat pipe is configured to transfer thermal energy from the computing element at the first end of the heat pipe to the second end of the heat pipe such that the thermal energy is transferred to the vapor chamber, wherein the impeller transfers the thermal energy at the vapor chamber to the fin stack.

14 Claims, 10 Drawing Sheets

(56)  References Cited

U.S. PATENT DOCUMENTS

| | | | | |
|---|---|---|---|---|
| 2020/0396864 A1* | 12/2020 | Ku | ...................... | H05K 7/20309 |
| 2021/0015007 A1* | 1/2021 | Watanabe | ............... | G06F 1/203 |
| 2022/0217870 A1* | 7/2022 | Columbus | ........... | H05K 7/1092 |
| 2022/0295668 A1* | 9/2022 | Namboori | .......... | H05K 7/20336 |
| 2023/0069684 A1* | 3/2023 | Kitamura | ............. | H05K 7/2039 |
| 2023/0079287 A1* | 3/2023 | Kitamura | ............. | G06F 1/1669 |
| | | | | 361/679.09 |
| 2023/0200013 A1* | 6/2023 | Sano | ................. | H05K 7/20336 |
| | | | | 361/689 |
| 2023/0200014 A1* | 6/2023 | Wang | ................. | H05K 7/20336 |
| | | | | 361/700 |
| 2023/0337406 A1* | 10/2023 | Bawa | ................... | H01L 23/467 |
| 2023/0354552 A1* | 11/2023 | Lin | ..................... | F28D 15/0283 |
| 2023/0354553 A1* | 11/2023 | Ohyama | .............. | G06F 1/1681 |

* cited by examiner

THERMAL MANAGEMENT SYSTEM FOR AN INFORMATION HANDLING SYSTEM

BACKGROUND

Field of the Disclosure

The disclosure relates generally to an information handling system, and in particular, a thermal management system of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Temperature control is a critical aspect of information handling system performance optimization. Information handling systems rely on various cooling mechanisms to regulate temperature thereof. Overheating of the information handling system can lead to reduced performance, hardware damage, and system failure.

SUMMARY

Innovative aspects of the subject matter described in this specification may be embodied in a thermal management system for an information handling system, including: a fan including: a fan housing; an impeller coupled to the fan housing; a fin stack coupled to the fan; a heat pipe having a first end and a second end opposite to the first end, the heat pipe in thermal communication with a computing element at the first end of the heat pipe; and a vapor chamber coupled to the fan housing, the vapor chamber and the fan housing encasing the impeller, the vapor chamber coupled to the second end of the heat pipe, the vapor chamber in fluid communication with the heat pipe, wherein the heat pipe is configured to transfer thermal energy from the computing element at the first end of the heat pipe to the second end of the heat pipe such that the thermal energy is transferred to the vapor chamber, wherein the impeller transfers the thermal energy at the vapor chamber to the fin stack.

Other embodiments of these aspects include corresponding systems and apparatus.

These and other embodiments may each optionally include one or more of the following features. For instance, the heat pipe and the vapor chamber form a single cavity. The heat pipe is welded to the vapor chamber at the second end of the heat pipe to form the single cavity. The vapor chamber is in fluid communication with the heat pipe to transfer vapor from the heat pipe to the vapor chamber. The impeller transfers thermal energy of the vapor from the vapor chamber towards the fin stack. The vapor chamber includes a first region and a second region, the first region in superimposition with the fan housing, the second region having a first side and a second side opposite to the first side, the second side including a thermal pad, the thermal pad in thermal communication with an additional computing component. An additional heat pipe having a first end and a second end opposite to the first end, the additional heat pipe in thermal communication with the computing element at the first end of the additional heat pipe, wherein the vapor chamber is coupled to the second end of the additional heat pipe, the vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the vapor chamber. An additional heat pipe having a first end and a second end opposite to the first end, the additional heat pipe in thermal communication with the computing element at the first end of the additional heat pipe; and an additional vapor chamber coupled to the fan housing fan, the additional vapor chamber, the vapor chamber, and the fan housing encasing the impeller, the additional vapor chamber coupled to the second end of the additional heat pipe, the additional vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the additional vapor chamber, wherein the impeller transfers the thermal energy at the additional vapor chamber to the fin stack.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
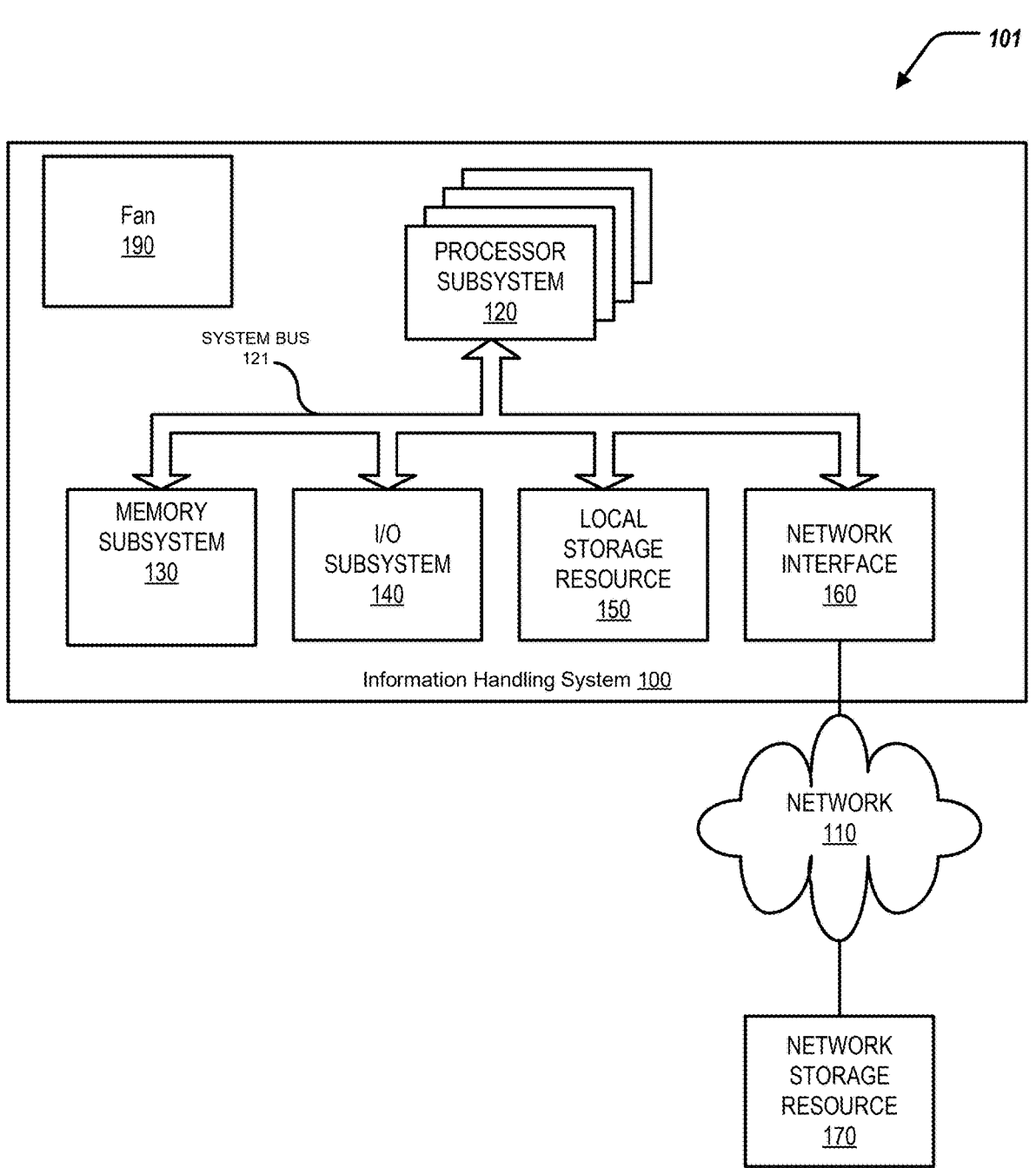
FIG. 1 is a block diagram of selected elements of an embodiment of an information handling system.

This disclosure discusses a thermal management system of an information handling system. In short, a heat pipe can be integrated with a vapor chamber (serving as a top cover of a fan) to form one internal fluid cavity to optimize a cooling surface area for the thermal management system. That is, the vapor chamber serves as the fan cover for the fan to increase a spreading heat capacity of the thermal management system.

Specifically, this disclosure discusses a thermal management system for an information handling system, including a fan including: a fan housing; an impeller coupled to the fan housing; a fin stack coupled to the fan; a heat pipe having a first end and a second end opposite to the first end, the heat pipe in thermal communication with a computing element at the first end of the heat pipe; and a vapor chamber coupled to the fan housing, the vapor chamber and the fan housing encasing the impeller, the vapor chamber coupled to the second end of the heat pipe, the vapor chamber in fluid communication with the heat pipe, wherein the heat pipe is configured to transfer thermal energy from the computing element at the first end of the heat pipe to the second end of the heat pipe such that the thermal energy is transferred to the vapor chamber, wherein the impeller transfers the thermal energy at the vapor chamber to the fin stack.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of a computing environment 101 including an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The information handling system can further include a fan 190.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (ISCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
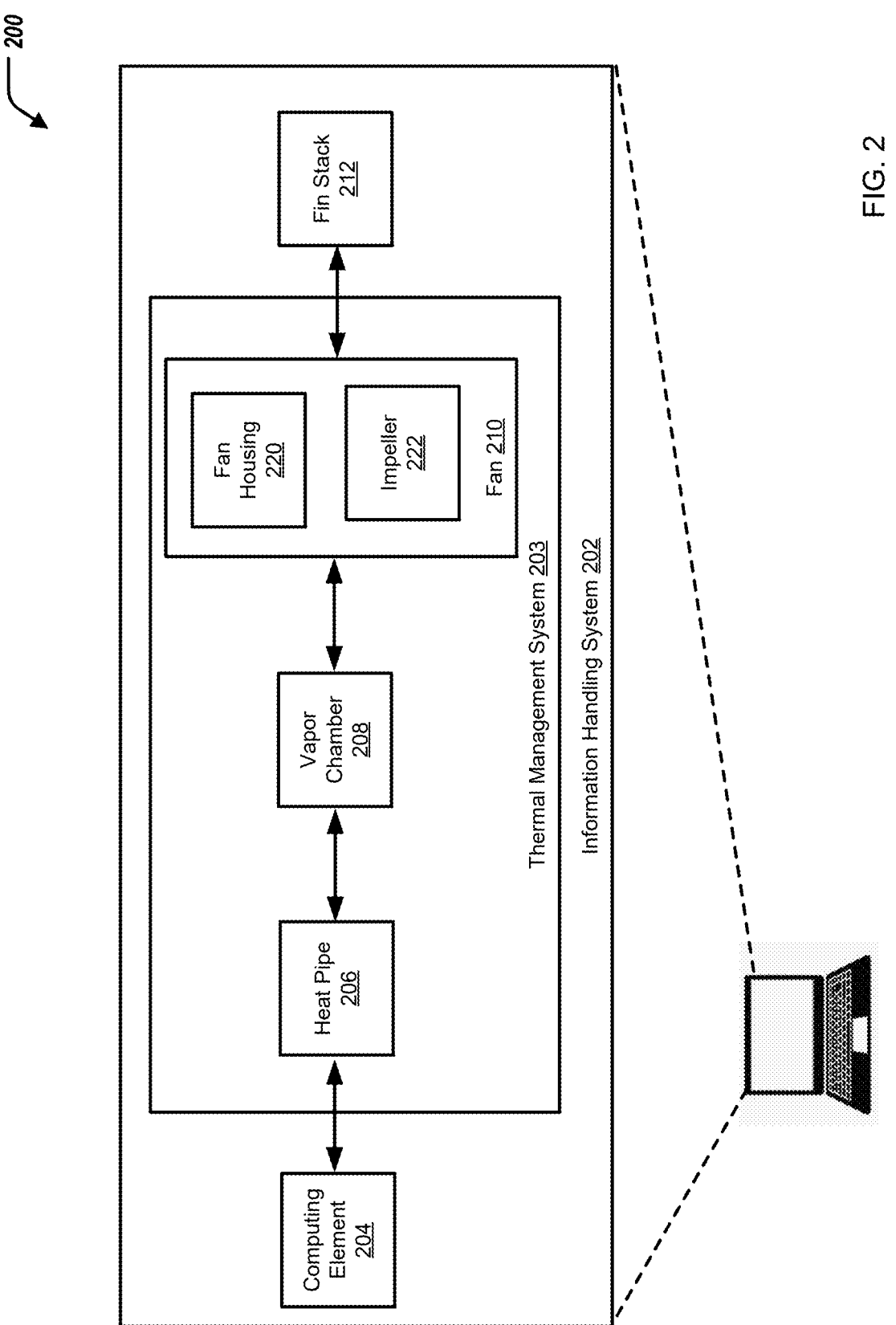
FIG. 2 illustrates a block diagram of an information handling system including a thermal management system.

Turning to FIG. 2, FIG. 2 illustrates an environment 200 including an information handling system 202. The information handling system 202 can include a computing element 204 and a thermal management system 203. The thermal management system 203 can include a heat pipe 206, a vapor chamber 208, a fan 210, and a fin stack 212. The fan 210 can include a fan housing 220 and an impeller 222. In some examples, the information handling system 202 is similar to, or includes, the information handling system 100 of FIG. 1. In some examples, the fan 210 is the same, or substantially the same, as the fan 190 of FIG. 1.

The computing element 204 can be in thermal communication with the heat pipe 206. The heat pipe 206 can be in thermal communication with the computing element 204 and the vapor chamber 208. The heat pipe 206 can further be in fluid communication with the vapor chamber 208. The vapor chamber 208 can be in thermal communication and fluid communication with the heat pipe 206 and the fan 210. The fan 210 can be in thermal communication with the vapor chamber 208 and the fin stack 212. The fin stack 212 can be in thermal communication with the fan 210.

In short, the heat pipe 206 can be integrated with the vapor chamber 208 (serving as a top cover of the fan 210) to form one internal fluid cavity to optimize a cooling surface area for the thermal management system 203. That is, the vapor chamber 208 serves as the fan cover for the fan 210 to increase a spreading heat capacity of the thermal management system 203.

Figure 3A:
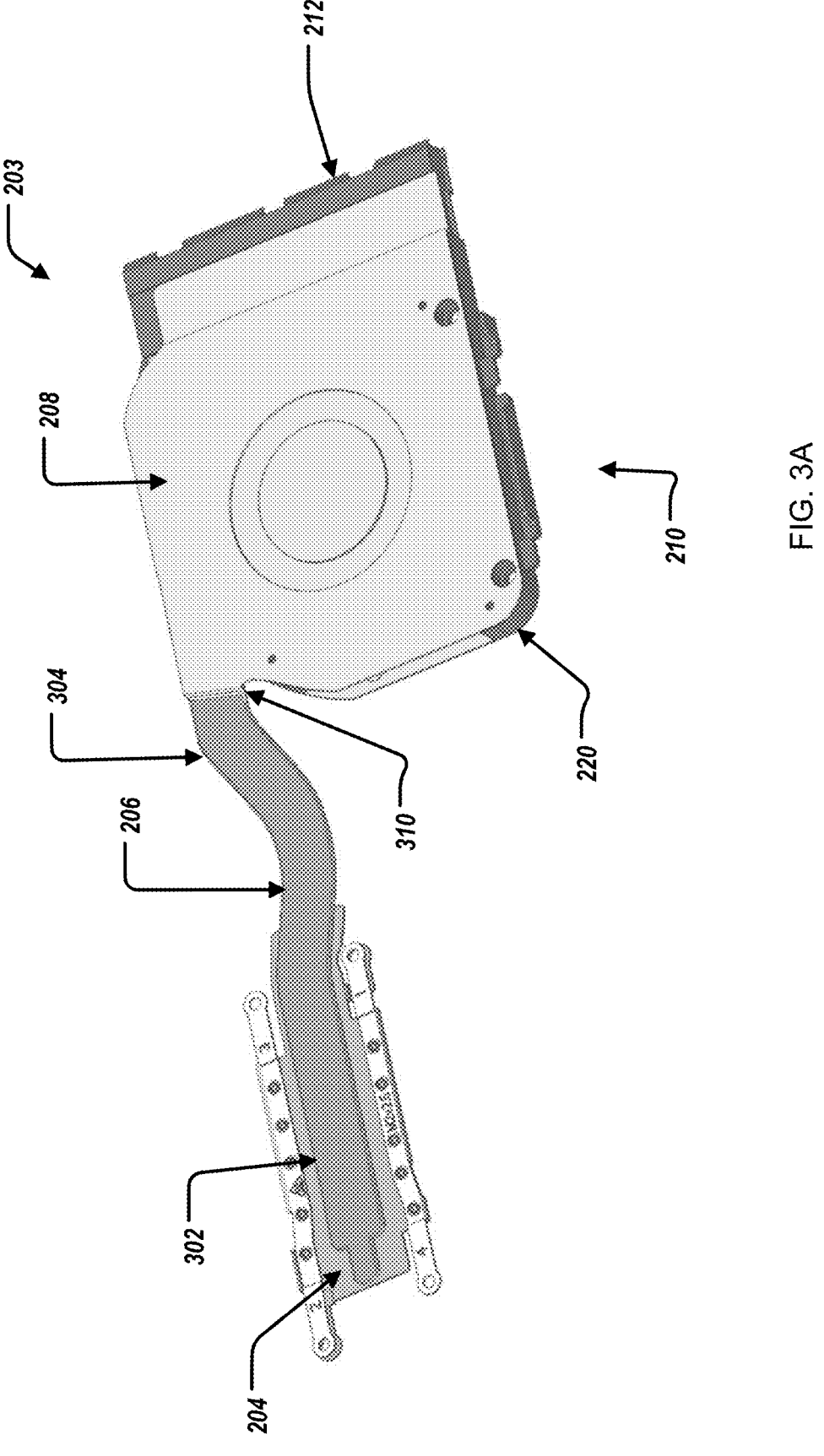
FIGS. 3A, 3B illustrate the thermal management system, in a first implementation.
Figure 3B:
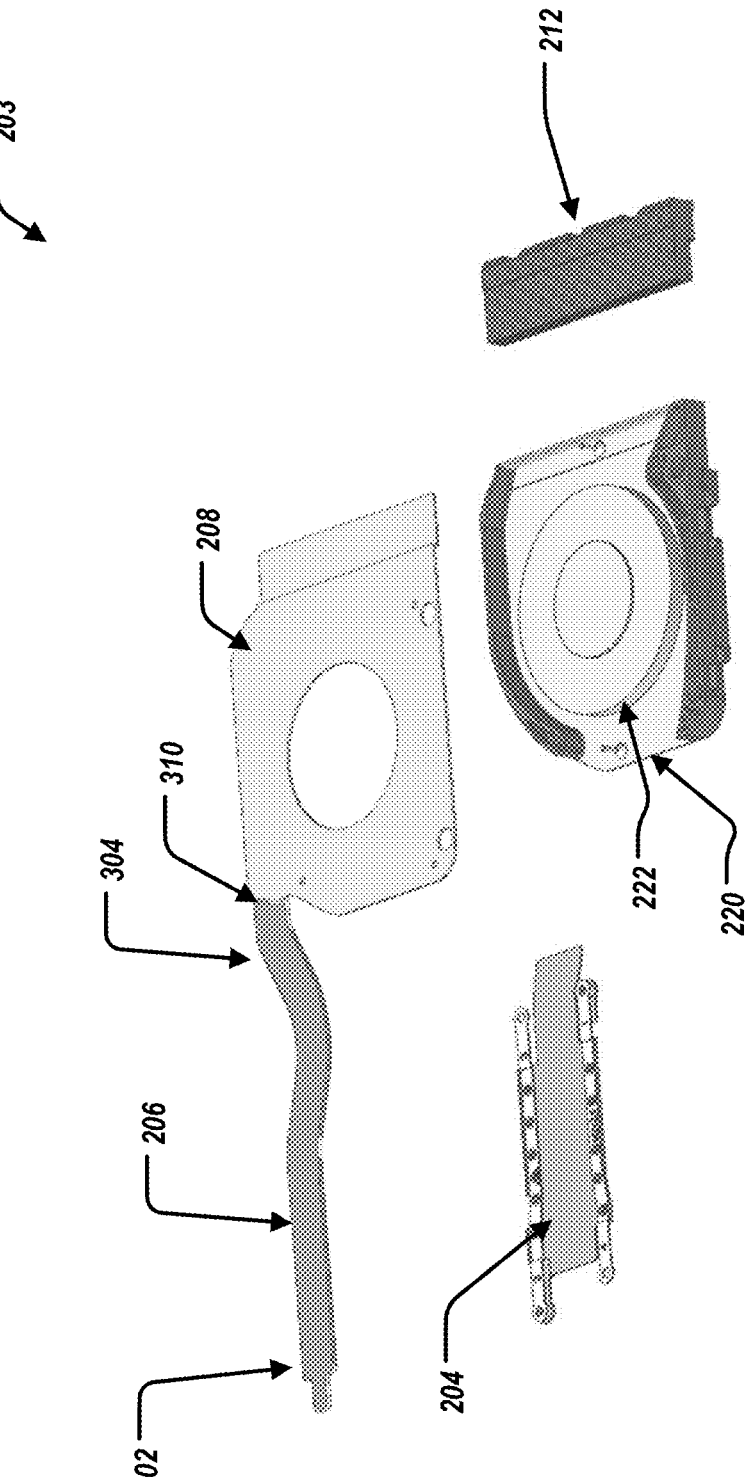

FIG. 3A illustrates a top down perspective view of the thermal management system 203, and FIG. 3B illustrates a top down exploded view of the thermal management system 203. Referring to FIGS. 3A, 3B, the thermal management system 203 can include the fan 210, the fan housing 220 and the impeller 222. The impeller 222 can be coupled to the fan housing 220. The thermal management system 203 can include the fin stack 212 coupled to the fan 210. In particular, the fin stack 212 is coupled to the fan housing 220.

The thermal management system 203 can include the heat pipe 206. The heat pipe 206 can include a first end 302 and a second end 304. The second end 304 is opposite to the first end 302. The heat pipe 206 is in thermal communication with the computing element 204. Specifically, the heat pipe 206 is in thermal communication with the computing element 204 at the first end 302 of the heat pipe 206.

The thermal management system 203 can include the vapor chamber 208. The vapor chamber 208 is coupled to the fan housing 220. When the vapor chamber 208 is coupled to the fan housing 220, the vapor chamber 208 and the fan housing 220 encase the impeller 222. The vapor chamber 208 is coupled to the heat pipe 206, and in particular, the vapor chamber 208 is coupled to the second end 304 of the heat pipe 206. The vapor chamber 208 is in fluid communication with the heat pipe 206.

In some examples, the heat pipe 206 and the vapor chamber 208 form a single cavity. In some examples, the heat pipe 206 and the vapor chamber 208 form a single continuous cavity. In some examples, the heat pipe 206 is welded to the vapor chamber 208 (e.g., at interface 310). That is, the heat pipe 206 is welded to the vapor chamber 208 at the second end 304 of the heat pipe 206 (e.g., at interface 310) to form the single (continuous) cavity.

The fin stack 212 is coupled to the vapor chamber 208. The fin stack 212 is in thermal communication with the vapor chamber 208.

The computing element 204 can generate, or be a source of, heat and/or thermal energy. To that end, the heat pipe 206 is configured to transfer thermal energy from the computing element 204 at the first end 302 of the heat pipe 206 to the second end 304 of the heat pipe 206. Specifically, the heat pipe 206 can be a vacuum pulled chamber in which a liquid (e.g., water) is located. As the computing element 204 generates thermal energy, the heat pipe 206 absorbs such thermal energy, and as a result of the vacuum pressure within the heat pipe 206, the liquid boils and evaporates within a wicking structure of the heat pipe 206. This gas then moves from the first end 302 of the heat pipe 206 to the second end 304 of the heat pipe 206 (due to positive pressure within the heat pipe 206).

The heat pipe 206 then transfers the thermal energy to the vapor chamber 208. That is, the vapor chamber 208 is in fluid communication with the heat pipe 206 to transfer vapor from the heat pipe 206 to the vapor chamber 208. Specifically, the evaporated high energy liquid (water vapor/gas) is transported from the heat pipe 206 to the vapor chamber 208 (due to positive pressure within the heat pipe 206). The impeller 222 transfer the thermal energy of the vapor from the vapor chamber 208 towards the fin stack 212. That is, the fan 210/impeller 222 blows the vapor/gas through the fin stack 212 to facilitate removal of heat from the thermal management system 203. That is, thermal energy is removed from the thermal management system 203. In turn, as the thermal energy is removed, the vapor/gas turns back to a fluid, and is wicked back to the heat pipe 206 and returns to a liquid state.

Figure 4A:
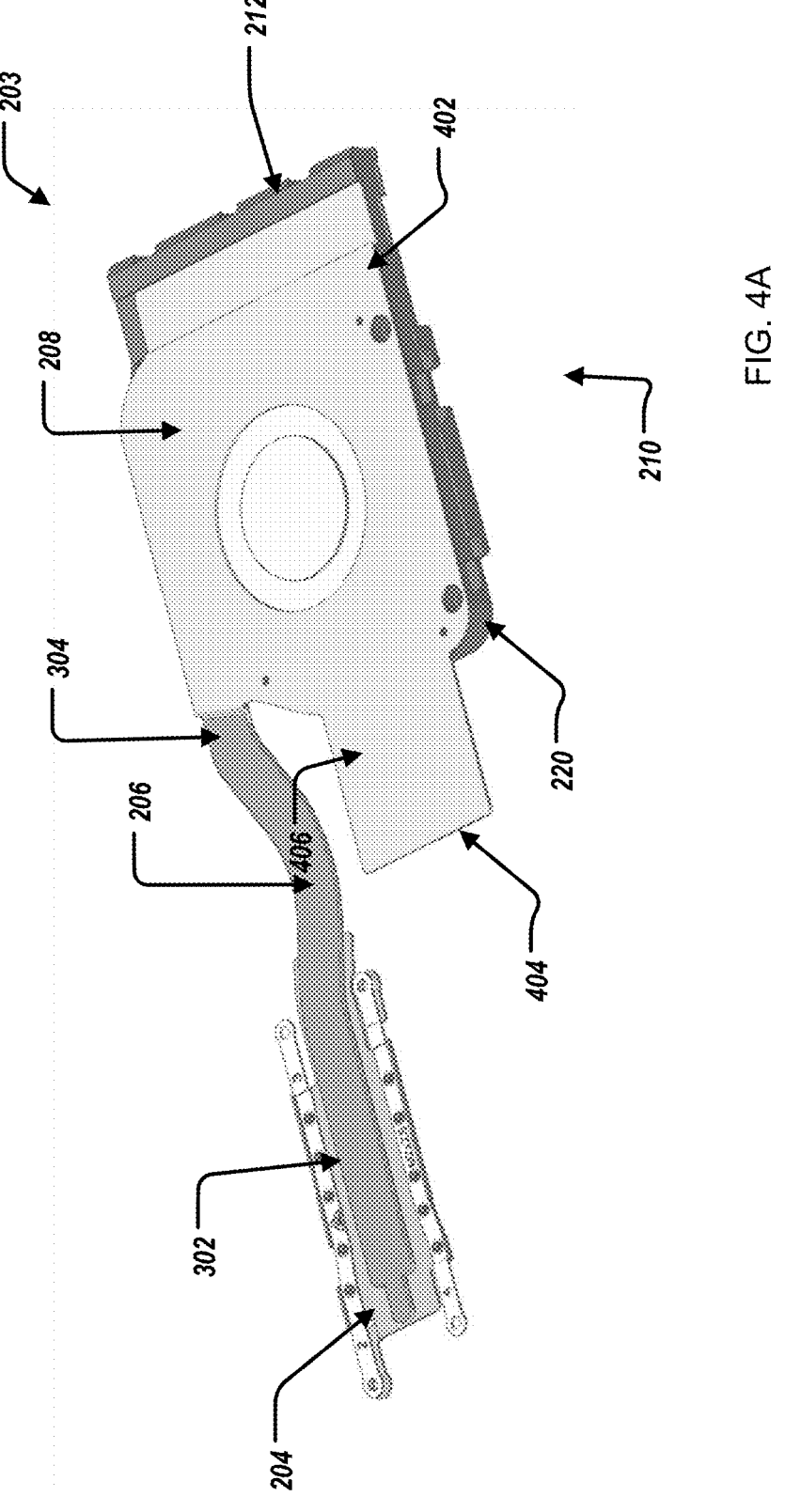
FIGS. 4A, 4B illustrate the thermal management system, in a second implementation.
Figure 4B:
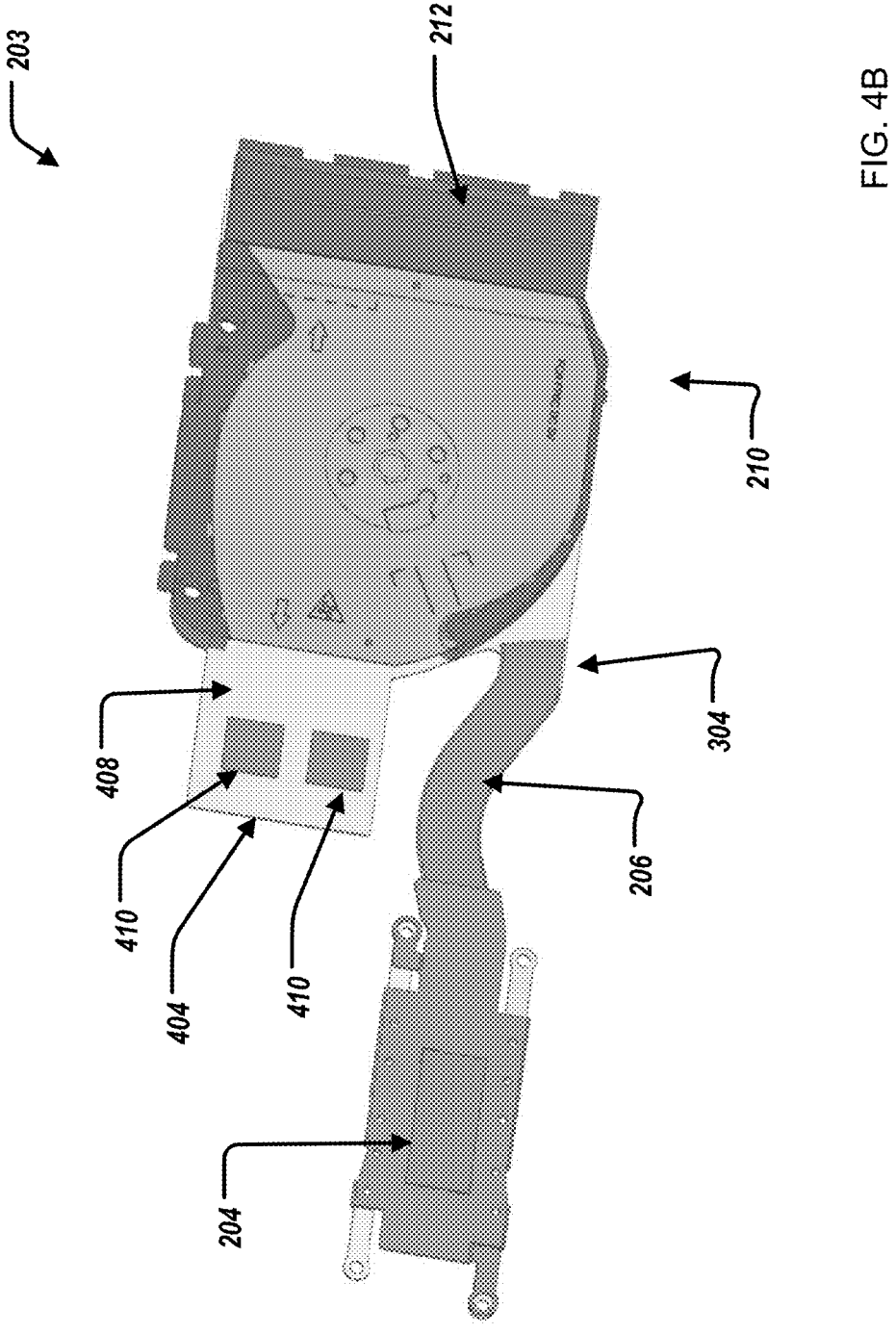

FIG. 4A illustrates a top down perspective view of the thermal management system 203, in a further implementation, and FIG. 4B illustrates a bottom up view of the thermal management system 203, in the further implementation. Referring to FIGS. 4A, 4B, the vapor chamber 208 can further include a first region 402 and a second region 404. The first region 402 of the vapor chamber 208 is in superimposition with the fan 210, and in particular, the fan housing 220. The second region 404 can include a first side 406 and a second side 408, the second side 408 opposite to the first side 406. The second side 408 of the second region 404 of the vapor chamber 208 can include one or more thermal pads 410. The thermal pads 410 can be in thermal communication with additional computing components (e.g., memory) that are positioned on a printed circuit board (PCB) adjacent to the second region 404 of the vapor chamber 208. That is, the computing components are not directly in superimposition with the fan 210, but benefit from the thermal management system 203, and the heat transfer though the vapor chamber 208 to the fin stack 212.

Figure 5A:
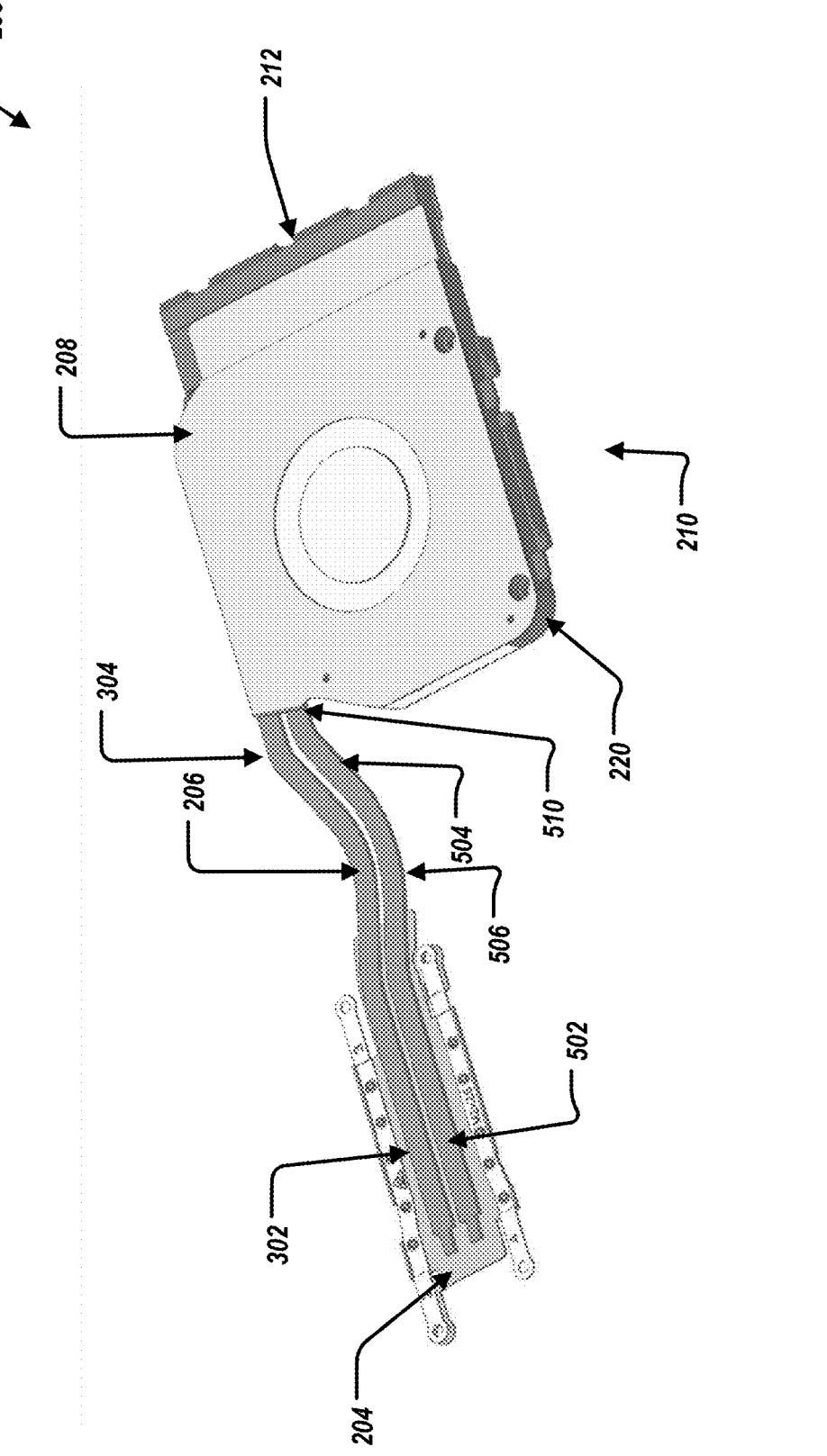
FIGS. 5A, 5B illustrate the thermal management system, in a third implementation.
Figure 5B:
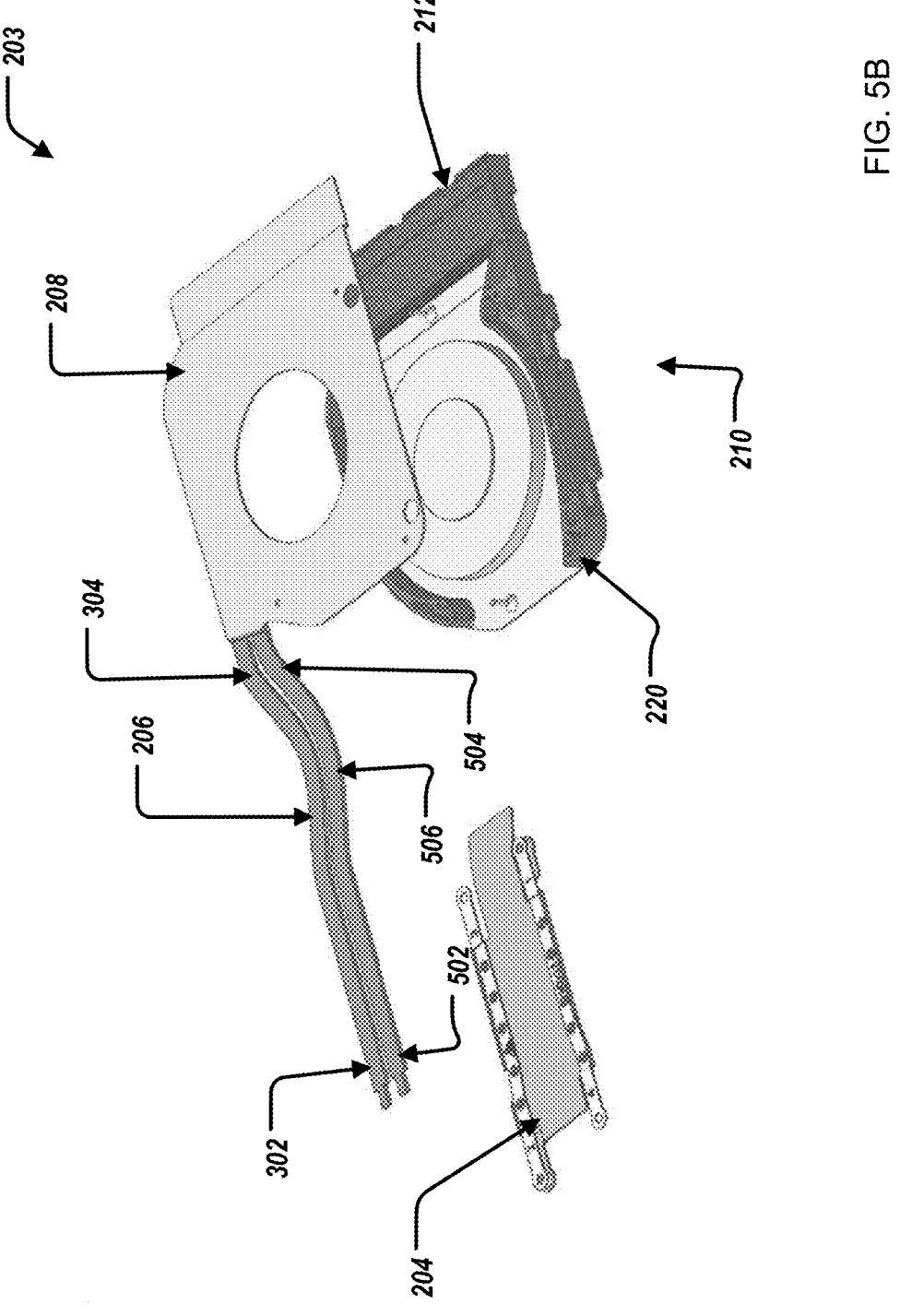

FIG. 5A illustrates a top down perspective view of the thermal management system 203, in a further implementation, and FIG. 5B illustrates a top down exploded view of the thermal management system 203, in the further implementation. Referring to FIGS. 5A, 5B, the thermal management system 203 can include an additional heat pipe 506. The additional heat pipe 506 can include a first end 502 and a second end 504. The second end 504 is opposite to the first end 502. The additional heat pipe 506 is in thermal communication with the computing element 204. Specifically, the additional heat pipe 506 is in thermal communication with the computing element 204 at the first end 502 of the additional heat pipe 506.

The vapor chamber 208 is additionally coupled to the additional heat pipe 506, and in particular, the vapor chamber 208 is coupled to the second end 504 of the additional heat pipe 506. The vapor chamber 208 is in fluid communication with the additional heat pipe 506.

In some examples, the additional heat pipe 506 is welded to the vapor chamber 208 (e.g., at interface 510). That is, the additional heat pipe 406 is welded to the vapor chamber 208 at the second end 404 of the additional heat pipe 506 (e.g., at interface 510) to form an additional cavity.

The computing element 204 can generate, or be a source of, heat and/or thermal energy. To that end, the heat pipe 206 is configured to transfer thermal energy from the computing element 204 at the first end 302 of the heat pipe 206 to the second end 304 of the heat pipe 206; and the additional heat pipe 506 is configured to transfer thermal energy from the computing element 204 at the first end 502 of the additional heat pipe 506 to the second end 504 of the additional heat pipe 506. Specifically, the additional heat pipe 506 can be a vacuum pulled chamber in which a liquid (e.g., water) is located. As the computing element 204 generates thermal energy, the additional heat pipe 506 absorbs such thermal energy, and as a result of the vacuum pressure within the additional heat pipe 506, the liquid boils and evaporates within a wicking structure of the additional heat pipe 506. This gas then moves from the first end 402 of the additional heat pipe 506 to the second end 504 of the additional heat pipe 506 (due to positive pressure within the additional heat pipe 506).

The additional heat pipe 506 then transfers the thermal energy to the vapor chamber 208. That is, the vapor chamber 208 is in fluid communication with the additional heat pipe 506 to transfer vapor from the additional heat pipe 506 to the vapor chamber 208. Specifically, the evaporated high energy liquid (water vapor/gas) is transported from the additional heat pipe 506 to the vapor chamber 208 (due to positive pressure within the additional heat pipe 506). The impeller 222 transfers the thermal energy of the vapor from the vapor chamber 208 towards the fin stack 212. That is, the fan 210/impeller 222 blows the vapor/gas through the fin stack 212 to facilitate removal of heat from the thermal management system 203. That is, thermal energy is removed from the thermal management system 203. In turn, as the thermal energy is removed, the vapor/gas turns back to a fluid, and is wicked back to the additional heat pipe 506 and returns to a liquid state.

Figure 6A:
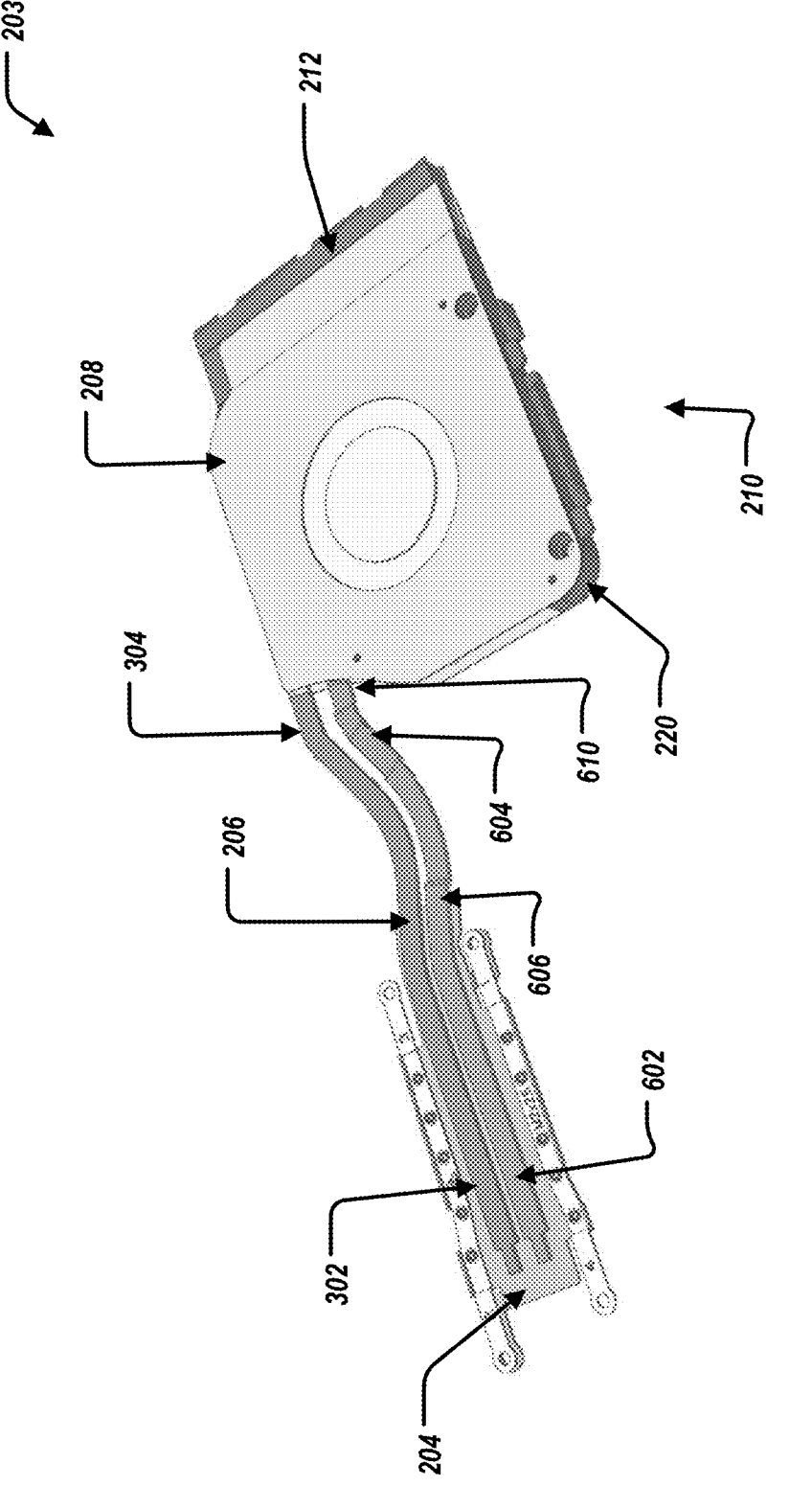
FIGS. 6A, 6B illustrate the thermal management system, in a fourth implementation.
Figure 6B:
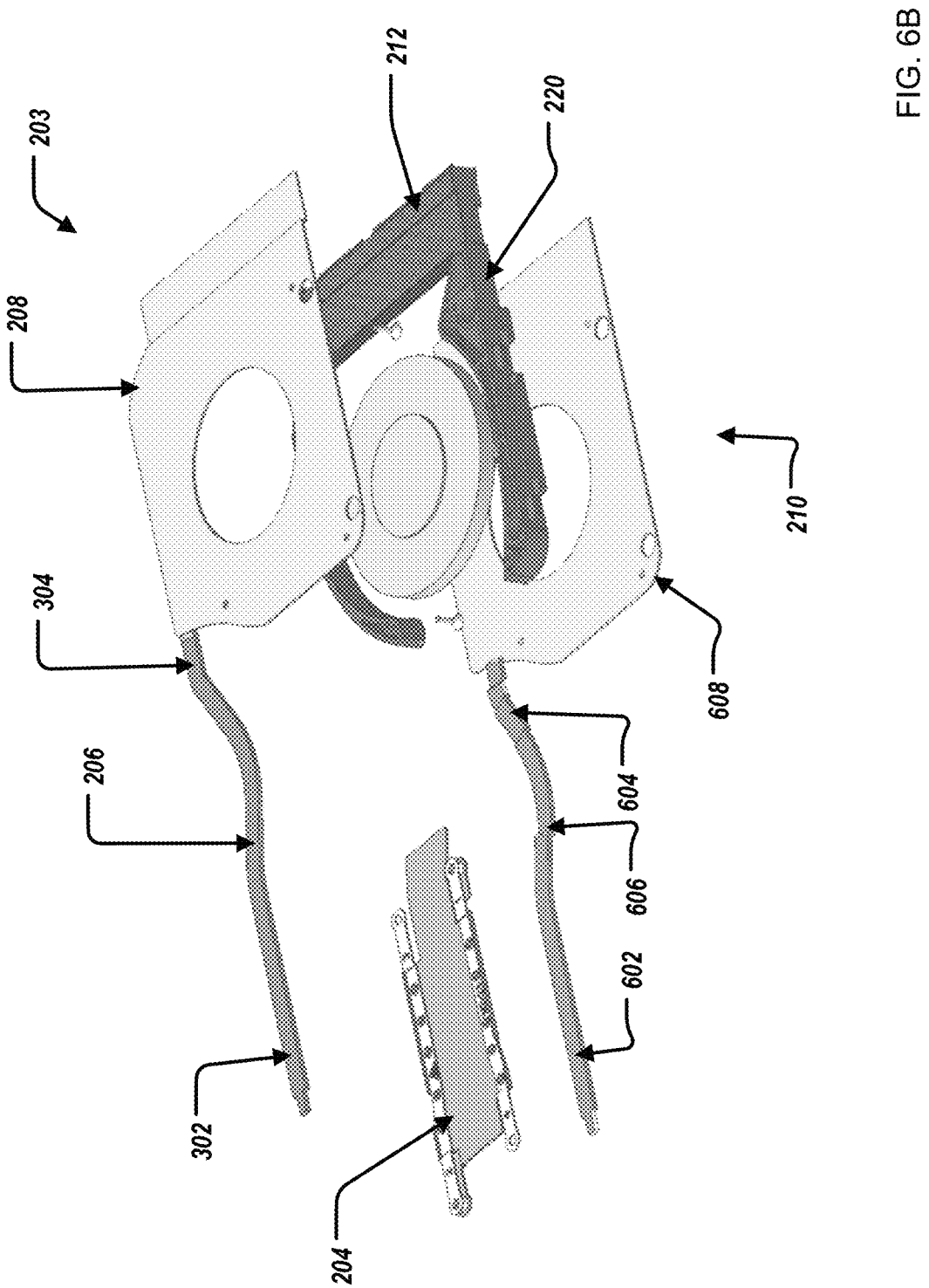

FIG. 6A illustrates a top down perspective view of the thermal management system 203, in a further implementation, and FIG. 6B illustrates a top down exploded view of the thermal management system 203, in a further implementation. Referring to FIGS. 6A, 6B, the thermal management system 203 can include an additional heat pipe 606. The additional heat pipe 606 can include a first end 602 and a second end 604. The second end 604 is opposite to the first end 602. The additional heat pipe 606 is in thermal communication with the computing element 204. Specifically, the additional heat pipe 606 is in thermal communication with the computing element 204 at the first end 602 of the additional heat pipe 606.

The thermal management system 203 can include an additional vapor chamber 608. The additional vapor chamber 608 is coupled to the fan housing 220. When the vapor chamber 208 is coupled to the fan housing 220 and the additional vapor chamber 608 is coupled to the fan housing 220, the vapor chamber 208, the additional vapor chamber 608, and the fan housing 220 encase the impeller 222. The additional vapor chamber 608 is coupled to the additional heat pipe 606, and in particular, the additional vapor chamber 608 is coupled to the second end 604 of the additional heat pipe 606. The additional vapor chamber 608 is in fluid communication with the additional heat pipe 606.

In some examples, the additional heat pipe 606 and the additional vapor chamber 608 form a single cavity. In some examples, the additional heat pipe 606 and the additional vapor chamber 608 form a single continuous cavity. In some examples, the additional heat pipe 606 is welded to the additional vapor chamber 608 (e.g., at interface 610). That is, the additional heat pipe 606 is welded to the additional vapor chamber 608 at the second end 604 of the additional heat pipe 606 (e.g., at interface 610) to form the single (continuous) cavity.

The fin stack 212 is coupled to the additional vapor chamber 608. The fin stack 212 is in thermal communication with the additional vapor chamber 608.

The computing element 204 can generate, or be a source of, heat and/or thermal energy. To that end, the additional heat pipe 606 is configured to transfer thermal energy from the computing element 204 at the first end 602 of the additional heat pipe 606 to the second end 604 of the additional heat pipe 606. Specifically, the additional heat pipe 606 can be a vacuum pulled chamber in which a liquid (e.g., water) is located. As the computing element 204 generates thermal energy, the additional heat pipe 606 absorbs such thermal energy, and as a result of the vacuum pressure within the additional heat pipe 606, the liquid boils and evaporates within a wicking structure of the additional heat pipe 606. This gas then moves from the first end 602 of the additional heat pipe 606 to the second end 604 of the additional heat pipe 606 (due to positive pressure within the additional heat pipe 606).

The additional heat pipe 606 then transfers the thermal energy to the additional vapor chamber 608. That is, the additional vapor chamber 608 is in fluid communication with the additional heat pipe 606 to transfer vapor from the additional heat pipe 606 to the additional vapor chamber 608. Specifically, the evaporated high energy liquid (water vapor/gas) is transported from the additional heat pipe 606 to the additional vapor chamber 608 (due to positive pressure within the additional heat pipe 606). The impeller 222 transfer the thermal energy of the vapor from the additional vapor chamber 608 towards the fin stack 212. That is, the fan 210/impeller 222 blows the vapor/gas through the fin stack 212 to facilitate removal of heat from the thermal management system 203. That is, thermal energy is removed from the thermal management system 203. In turn, as the thermal energy is removed, the vapor/gas turns back to a fluid, and is wicked back to the additional heat pipe 606 and returns to a liquid state.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A thermal management system for an information handling system, including:
 a fan including:
  a fan housing;
  an impeller coupled to the fan housing;
 a fin stack coupled to the fan;
 a heat pipe having a first end and a second end opposite to the first end, the heat pipe in thermal communication with a computing element at the first end of the heat pipe; and
 a vapor chamber coupled to the fan housing, the vapor chamber and the fan housing encasing the impeller, the vapor chamber coupled to the second end of the heat pipe, the vapor chamber in fluid communication with the heat pipe, the vapor chamber including:
  a first region in superimposition with the fan housing;
  a second region extending from the first region and spaced-apart from the fan housing, the second region including:
   a first side;
   a second side opposite to the first side, the second side facing a printed circuit board, the second side including:
    a thermal pad in thermal communication with an additional computing component that is positioned on the PCB adjacent to the second region and spaced-apart from the fan,
 wherein the heat pipe is configured to transfer thermal energy from the computing element at the first end of the heat pipe to the second end of the heat pipe such that the thermal energy is transferred to the vapor chamber, wherein the impeller transfers the thermal energy at the vapor chamber to the fin stack.

2. The thermal management system of claim 1, wherein the heat pipe and the vapor chamber form a single cavity.

3. The thermal management system of claim 2, wherein the heat pipe is welded to the vapor chamber at the second end of the heat pipe to form the single cavity.

4. The thermal management system of claim 1, wherein the vapor chamber is in fluid communication with the heat pipe to transfer vapor from the heat pipe to the vapor chamber.

5. The thermal management system of claim 4, wherein the impeller transfers thermal energy of the vapor from the vapor chamber towards the fin stack.

6. The thermal management system of claim 1, further including:

an additional heat pipe having a first end and a second end opposite to the first end, the additional heat pipe in thermal communication with the computing element at the first end of the additional heat pipe, wherein the vapor chamber is coupled to the second end of the additional heat pipe, the vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the vapor chamber.

7. The thermal management system of claim 1, further including:

an additional heat pipe having a first end and a second end opposite to the first end, the additional heat pipe in thermal communication with the computing element at the first end of the additional heat pipe; and an additional vapor chamber coupled to the fan housing fan, the additional vapor chamber, the vapor chamber, and the fan housing encasing the impeller, the additional vapor chamber coupled to the second end of the additional heat pipe, the additional vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the additional vapor chamber, wherein the impeller transfers the thermal energy at the additional vapor chamber to the fin stack.

8. An information handling system, comprising:

a processor;

memory media storing instructions executable by the processor to perform operations;

a thermal management system, including:

a fan including:

a fan housing;

an impeller coupled to the fan housing;

a fin stack coupled to the fan;

a heat pipe having a first end and a second end opposite to the first end, the heat pipe in thermal communication with a computing element at the first end of the heat pipe; and a vapor chamber coupled to the fan housing, the vapor chamber and the fan housing encasing the impeller, the vapor chamber coupled to the second end of the heat pipe, the vapor chamber in fluid communication with the heat pipe, the vapor chamber including:

a first region in superimposition with the fan housing;

a second region extending from the first region and spaced-apart from the fan housing, the second region including:

a first side;

a second side opposite to the first side, the second side facing a printed circuit board, the second side including:

a thermal pad in thermal communication with an additional computing component that is positioned on the PCB adjacent to the second region and spaced-apart from the fan, wherein the heat pipe is configured to transfer thermal energy from the computing element at the first end of the heat pipe to the second end of the heat pipe such that the thermal energy is transferred to the vapor chamber, wherein the impeller transfers the thermal energy at the vapor chamber to the fin stack.

9. The information handling system of claim 8, wherein the heat pipe and the vapor chamber form a single cavity.

10. The information handling system of claim 9, wherein the heat pipe is welded to the vapor chamber at the second end of the heat pipe to form the single cavity.

11. The information handling system of claim 8, wherein the vapor chamber is in fluid communication with the heat pipe to transfer vapor from the heat pipe to the vapor chamber.

12. The information handling system of claim 11, wherein the impeller transfers thermal energy of the vapor from the vapor chamber towards the fin stack.

13. The information handling system of claim 8, the thermal management system further including:

an additional heat pipe having a first end and a second end opposite to the first end, the additional heat pipe in thermal communication with the computing element at the first end of the additional heat pipe, wherein the vapor chamber is coupled to the second end of the additional heat pipe, the vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the vapor chamber.

14. The thermal management system of claim 8, the thermal management system further including:

an additional heat pipe having a first end and a second end opposite to the first end, the additional heat pipe in thermal communication with the computing element at the first end of the additional heat pipe; and an additional vapor chamber coupled to the fan housing fan, the additional vapor chamber, the vapor chamber, and the fan housing encasing the impeller, the additional vapor chamber coupled to the second end of the additional heat pipe, the additional vapor chamber in fluid communication with the additional heat pipe, wherein the additional heat pipe is configured to transfer thermal energy from the computing element at the first end of the additional heat pipe to the second end of the additional heat pipe such that such the thermal energy is transferred to the additional vapor chamber, wherein the impeller transfers the thermal energy at the additional vapor chamber to the fin stack.

* * * * *